United States Patent
Chang (10) Patent No.: US 7,512,764 B2
(45) Date of Patent: Mar. 31, 2009

(54) METHOD FOR ALLOCATING A MEMORY OF A DE-INTERLEAVING UNIT

(75) Inventor: Wen-Jeng Chang, Yonghe (TW)

(73) Assignee: Tian Holdings, LLC, Wilmington, DE (US)

( * ) Notice: Subject to any disclaimer, the term of this patent is extended or adjusted under 35 U.S.C. 154(b) by 514 days.

(21) Appl. No.: 10/843,706

(22) Filed: May 10, 2004

(65) Prior Publication Data
US 2004/0260892 A1    Dec. 23, 2004

Related U.S. Application Data

(63) Continuation-in-part of application No. 10/173,234, filed on Jun. 14, 2002, now Pat. No. 6,754,790.

(30) Foreign Application Priority Data
Aug. 24, 2001  (TW) .............................. 90120811 A (51) Int. Cl.
G06F 12/02    (2006.01)
(52) U.S. Cl. ...................................... 711/170
(58) Field of Classification Search .................. 341/81; 711/170–171
See application file for complete search history.

(56) References Cited

U.S. PATENT DOCUMENTS

| 5,453,964 | A | 9/1995 | Shimizume |
| 5,517,484 | A | 5/1996 | Takagi et al. |
| 6,112,324 | A | 8/2000 | Howe et al. |
| 6,278,715 | B1 * | 8/2001 | Hansquine .................. 370/428 |
| 6,346,896 | B1 | 2/2002 | Su et al. |
| 6,754,790 | B2 | 6/2004 | Chang et al. |
| 2003/0021338 | A1 * | 1/2003 | Mazzoni et al. ............. 375/219 |
| 2003/0093750 | A1 * | 5/2003 | Cameron .................... 714/780 |
| 2004/0058170 | A1 * | 3/2004 | Sakurada et al. ............ 428/432 |
| 2005/0094677 | A1 * | 5/2005 | Lu et al. ..................... 370/535 |
| 2005/0096918 | A1 * | 5/2005 | Rao et al. ................... 704/500 |

FOREIGN PATENT DOCUMENTS

TW    550545    9/2003

OTHER PUBLICATIONS

Sheu et al., "A Buffer Allocation Mechanism for VBR Video Playback," IEEE, Aug. 21-25, 2000, pp. 1641-1644.*

* cited by examiner

Primary Examiner—Shane M Thomas
(74) Attorney, Agent, or Firm—Perkins Coie LLP (57) ABSTRACT

A method is proposed for utilizing a memory of a de-interleaving unit comprising the steps of determining a size of the memory according to a maximal symbol number of a data frame, a delay value, an adjustable parameter, and a half of a total symbol number of the data frame; accessing the memory according to a write memory address determined by a first algorithm during data buffering; and accessing the memory according to a read memory address determined by a second algorithm during data retrieving. The conventional access method has the drawback of ineffective use of the memory space of the de-interleaving unit, while the proposed method uses only about half the memory space for implementation.

26 Claims, 9 Drawing Sheets

FIG. 1 (PRIOR ART)

| | 0 | | ⋯ | | 27 |
|---|---|---|---|---|---|
| 0 | 0($f_{1,0}$) | | | | 27($f_{0,27}$) |
| 1 | 28 ($f_{2,0}$) | | | | 55 ($f_{1,27}$) |
| ⋮ | | | | | |
| 104 | 2912 ($f_{105,0}$) | 2913 ($f_{0,1}$) | 2912 ($f_{4,2}$) | | 2939 ($f_{104,27}$) |
| 105 | 2940 ($f_{106,0}$) | 2941 ($f_{1,1}$) | 2942 ($f_{5,2}$) | | 2767 ($f_{105,27}$) |
| 106 | 2968 ($f_{107,0}$) | 2969 ($f_{2,1}$) | 2970 ($f_{6,2}$) | | 2995 ($f_{106,27}$) |
| 107 | 2996 ($f_{108,0}$) | 2997 ($f_{3,1}$) | 2998 ($f_{7,2}$) | | 3023 ($f_{107,27}$) |
| 108 | 3024 ($f_{0,0}$) | 3025 ($f_{4,1}$) | 3026 ($f_{8,2}$) | | 3051 ($f_{108,27}$) |

Width: 28; Height: 109

| WR | C0 | C1 | C2 | C3 | C4 | C5 | C6 | C7 | C8 | C9 | C10 | C11 | C12 | C13 | C14 | C15 | C16 | C17 | C18 | C19 | C20 | C21 | C22 | C23 | C24 | C25 | C26 | C27 |
|---|---|---|---|---|---|---|---|---|---|---|---|---|---|---|---|---|---|---|---|---|---|---|---|---|---|---|---|---|
| 0 | 0 | 116 | 232 | 348 | 464 | 580 | 696 | 812 | 928 | 1044 | 1160 | 1276 | 1392 | 1508 | 1564 | 1444 | 1324 | 1204 | 1084 | 964 | 844 | 724 | 604 | 484 | 364 | 244 | 124 | 4 |
| 1 | 1 | 117 | 233 | 349 | 465 | 581 | 697 | 813 | 929 | 1045 | 1161 | 1277 | 1393 | 1509 | 1565 | 1445 | 1325 | 1205 | 1085 | 965 | 845 | 725 | 605 | 485 | 365 | 245 | 125 | 5 |
| 2 | 2 | 118 | 234 | 350 | 466 | 582 | 698 | 814 | 930 | 1046 | 1162 | 1278 | 1394 | 1510 | 1566 | 1446 | 1326 | 1206 | 1086 | 966 | 846 | 726 | 606 | 486 | 366 | 246 | 126 | 6 |
| 3 | 3 | 119 | 235 | 351 | 467 | 583 | 699 | 815 | 931 | 1047 | 1163 | 1279 | 1395 | 1511 | 1567 | 1447 | 1327 | 1207 | 1087 | 967 | 847 | 727 | 607 | 487 | 367 | 247 | 127 | 7 |
| 4 | 4 | 120 | 236 | 352 | 468 | 584 | 700 | 816 | 932 | 1048 | 1164 | 1280 | 1396 | 1512 | 1568 | 1448 | 1328 | 1208 | 1088 | 968 | 848 | 728 | 608 | 488 | 368 | 248 | 128 | 8 |
| 5 | 5 | 121 | 237 | 353 | 469 | 585 | 701 | 817 | 933 | 1049 | 1165 | 1281 | 1397 | 1513 | 1569 | 1449 | 1329 | 1209 | 1089 | 969 | 849 | 729 | 609 | 489 | 369 | 249 | 129 | 9 |
| . | | | | | | | | | | | | | | | | | | | | | | | | | | | | |
| 47 | 47 | 163 | 279 | 351 | 511 | 627 | 743 | 859 | 975 | 1092 | 1207 | 1323 | 1439 | 1555 | 1611 | 1491 | 1371 | 1251 | 1131 | 1011 | 891 | 771 | 651 | 531 | 411 | 291 | 171 | 51 |
| 48 | 48 | 164 | 280 | 396 | 512 | 628 | 744 | 860 | 976 | 1093 | 1208 | 1324 | 1440 | 1556 | 1612 | 1492 | 1372 | 1252 | 1132 | 1012 | 892 | 772 | 652 | 532 | 412 | 292 | 172 | 52 |
| 49 | 49 | 165 | 281 | 397 | 513 | 629 | 745 | 861 | 977 | 1094 | 1209 | 1325 | 1441 | 1557 | 1613 | 1493 | 1373 | 1253 | 1133 | 1013 | 893 | 773 | 653 | 533 | 413 | 293 | 173 | 53 |

| RD | C0 | C1 | C2 | C3 | C4 | C5 | C6 | C7 | C8 | C9 | C10 | C11 | C12 | C13 | C14 | C15 | C16 | C17 | C18 | C19 | C20 | C21 | C22 | C23 | C24 | C25 | C26 | C27 |
|---|---|---|---|---|---|---|---|---|---|---|---|---|---|---|---|---|---|---|---|---|---|---|---|---|---|---|---|---|
| 8 | 8 | 128 | 248 | 368 | 488 | 608 | 728 | 848 | 968 | 1088 | 1208 | 1328 | 1448 | 1568 | 1512 | 1396 | 1280 | 1164 | 1048 | 932 | 816 | 700 | 584 | 468 | 352 | 236 | 120 | 4 |
| 9 | 9 | 129 | 249 | 369 | 489 | 609 | 729 | 849 | 969 | 1089 | 1209 | 1329 | 1449 | 1569 | 1513 | 1397 | 1281 | 1165 | 1049 | 933 | 817 | 701 | 585 | 469 | 353 | 237 | 121 | 5 |
| 10 | 10 | 130 | 250 | 370 | 490 | 610 | 730 | 850 | 970 | 1090 | 1210 | 1330 | 1450 | 1570 | 1514 | 1398 | 1282 | 1166 | 1050 | 934 | 818 | 702 | 586 | 470 | 354 | 238 | 122 | 6 |
| 11 | 11 | 131 | 251 | 371 | 491 | 611 | 731 | 851 | 971 | 1091 | 1211 | 1331 | 1451 | 1571 | 1515 | 1399 | 1283 | 1167 | 1051 | 935 | 819 | 703 | 587 | 471 | 355 | 239 | 123 | 7 |
| 12 | 12 | 132 | 252 | 372 | 492 | 612 | 732 | 852 | 972 | 1092 | 1212 | 1332 | 1452 | 1572 | 1516 | 1400 | 1284 | 1168 | 1052 | 936 | 820 | 704 | 588 | 472 | 356 | 240 | 124 | 8 |
| 13 | 13 | 133 | 253 | 373 | 493 | 613 | 733 | 853 | 973 | 1093 | 1213 | 1333 | 1453 | 1573 | 1517 | 1401 | 1285 | 1169 | 1053 | 937 | 821 | 705 | 589 | 473 | 357 | 241 | 125 | 9 |
| 56 | 56 | 176 | 296 | 416 | 536 | 656 | 776 | 896 | 1016 | 1136 | 1256 | 1376 | 1496 | 1616 | 1560 | 1444 | 1328 | 1212 | 1096 | 980 | 864 | 748 | 632 | 516 | 400 | 284 | 168 | 52 |
| 57 | 57 | 177 | 297 | 417 | 537 | 657 | 777 | 897 | 1017 | 1137 | 1257 | 1377 | 1497 | 1617 | 1561 | 1445 | 1329 | 1213 | 1097 | 981 | 865 | 749 | 633 | 517 | 401 | 285 | 169 | 53 |
| 58 | 58 | 178 | 298 | 418 | 538 | 658 | 778 | 898 | 1018 | 1138 | 1258 | 1378 | 1498 | 1618 | 1562 | 1446 | 1330 | 1214 | 1098 | 982 | 866 | 750 | 634 | 518 | 402 | 286 | 170 | 54 |

METHOD FOR ALLOCATING A MEMORY OF A DE-INTERLEAVING UNIT

CROSS-REFERENCE TO RELATED APPLICATION

This application is a continuation-in-part (CIP) application of the application "METHOD OF ACCESSING MEMORY OF DE-INTERLEAVING UNIT" with the application Ser. No. 10/173,234 filed Jun. 14, 2002 which is U.S. Pat. No. 6,754,790, and this application claims the priority benefit of Taiwan application serial no. 90120811, filed Aug. 24, 2001.

BACKGROUND OF THE INVENTION

1. Field of the Invention

This invention relates to a method for utilizing a memory of a de-interleaving unit in an optical disc drive device.

2. Description of Related Art

Figure 1:
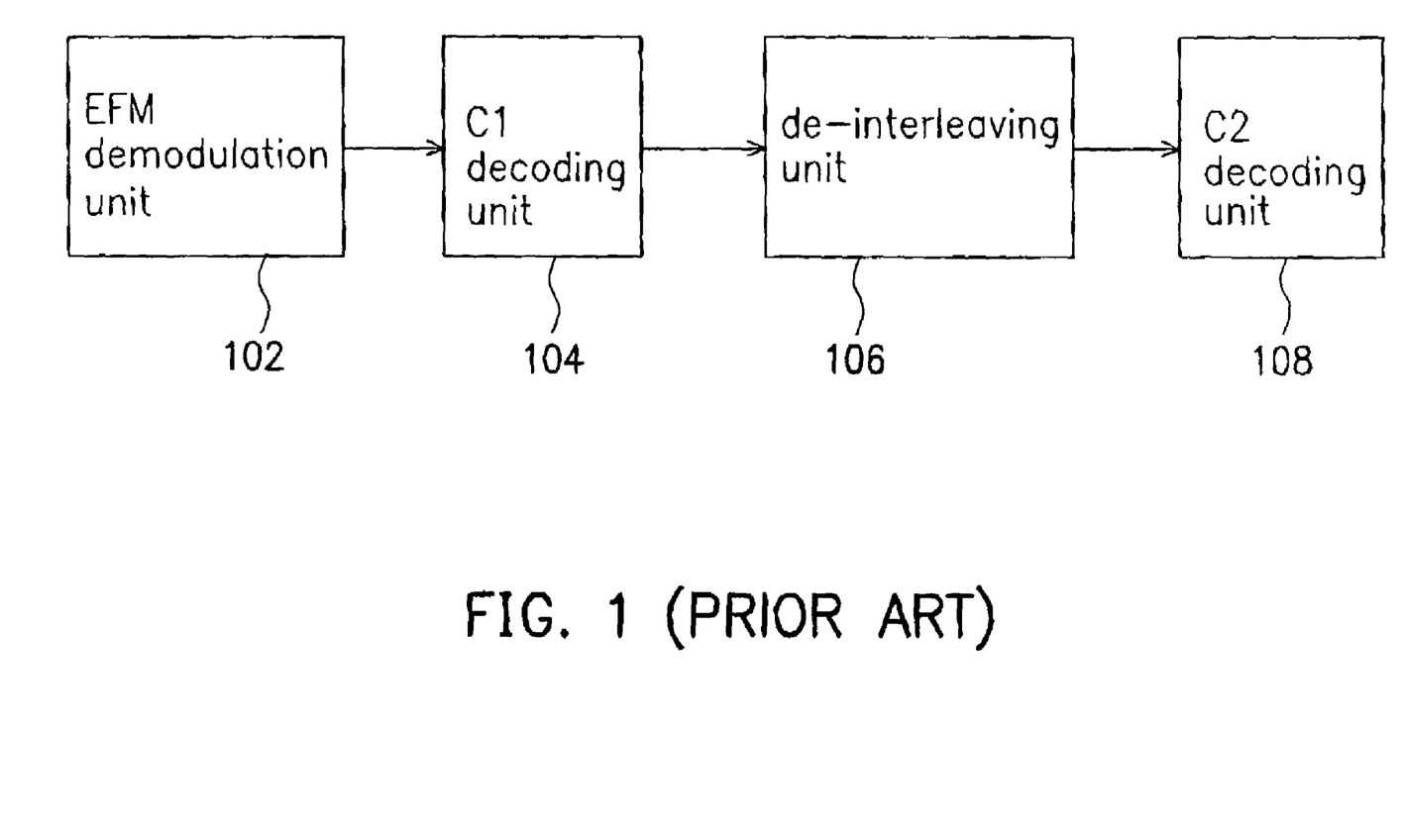
FIG. 1 (PRIOR ART) is a schematic diagram showing a series of functional units involved in a read operation in a CD-ROM drive.

To increase the reliability of read operation on a CD-ROM (Compact-Disc Read-Only-Memory) drive, data are interleaved before they are recorded on a CD-ROM disc. Therefore, the read operation in the CD-ROM drive should include a de-interleaving procedure. FIG. 1 is a schematic diagram showing a series of functional units involved in a read operation in the CD-ROM drive, which includes an EFM demodulation unit 102, a C1 decoding unit 104, a de-interleaving unit 106, and a C2 decoding unit 108. The EFM demodulation unit 102 is capable of demodulating data on the disc into a stream of 8-bit data. After the C1 decoding unit 104 receives a frame of 32 bytes (8-bit) data from the EFM demodulation unit 102, it decodes them into a frame of 28 bytes data and then transfers these decoded data to the de-interleaving unit 106 for de-interleaving. The de-interleaving unit 106 then transfers the de-interleaved data to the C2 decoding unit 108. During the de-interleaving procedure, each frame includes 28 bytes of data.

Figure 2:
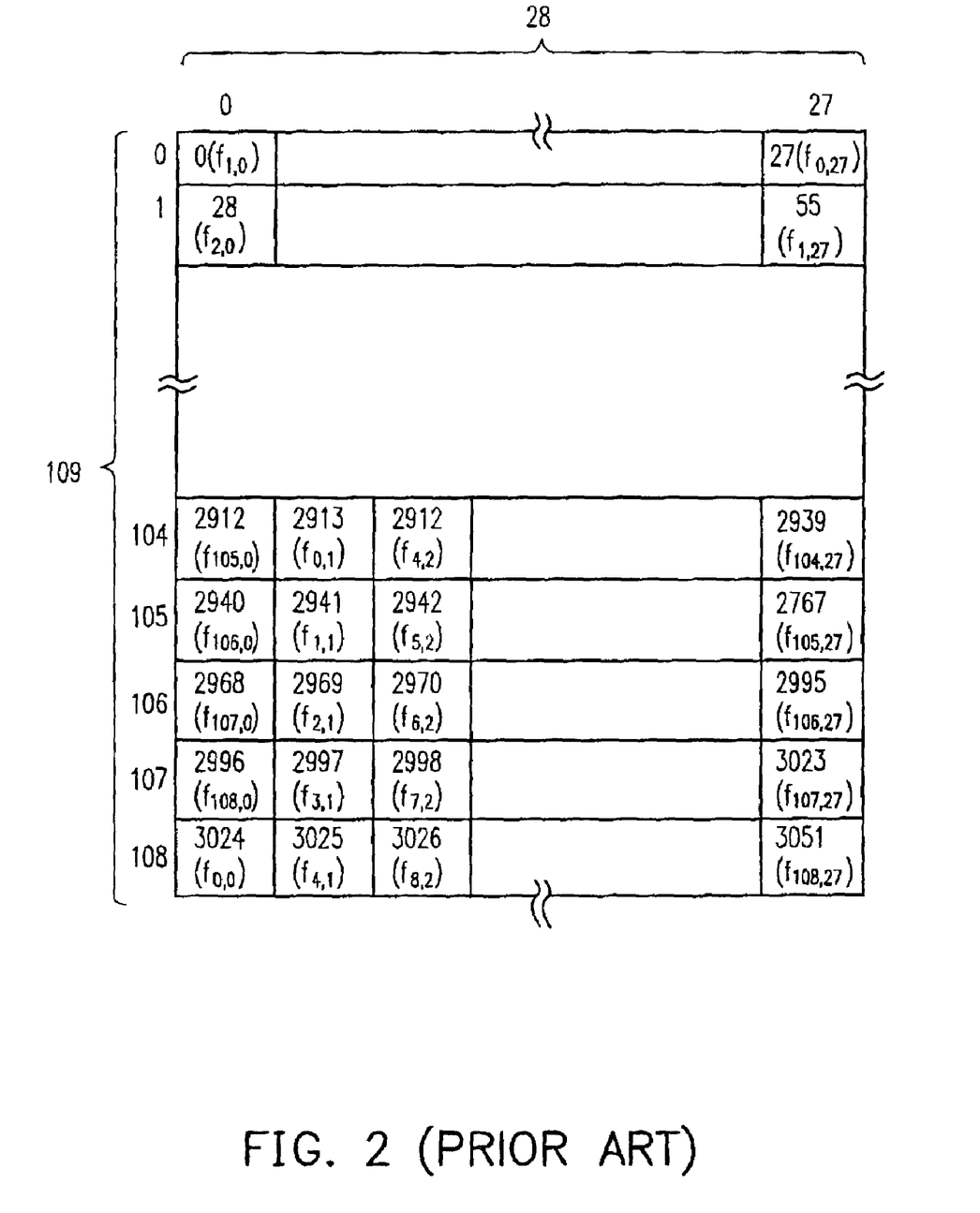
FIG. 2 (PRIOR ART) is a schematic diagram showing a memory allocation for the memory of de-interleaving unit according to the conventional access method.

The de-interleaving unit 106 includes a memory unit for the de-interleaving process. FIG. 2 shows the memory allocation for the memory of the de-interleaving unit 106. Referring to FIG. 2 together with FIG. 1, the address range is from 0 to 3051. The 28 8-bit (byte) data in the first frame from the C1 decoding unit 104 are respectively denoted by (f0, 0), (f0, 1) ..., (f0, 27). When the C decoding unit 104 transfers the first frame to the de-interleaving unit 106, data in the first frame are written into the memory of the de-interleaving unit 106 in such a manner according to the conventional access method as following. The first data (f0, 0) is written into Row 108 Column 0 (i.e., the address 3024); the second data (f0, 1) is written into Row 104 Column 1 (i.e., the address 2913); and so forth, the last data (f0, 27) is written into Row 0 Column 26 (i.e., the address 27).

After the first frame is written completely, the second frame is then written into the de-interleaving unit 106. In the following, the 28 8-bit data in the second frame from the C1 decoding unit 104 are respectively denoted by (f1, 0), (f1, 1) ..., (f1, 27). When the C1 decoding unit 104 transfers the second frame to the de-interleaving unit 106, data in the second frame are written into the memory of the de-interleaving unit 106 in such a manner according to conventional access method that the first data (f1, 0) is written into Row 109 Column 0 (i.e., the address 0); the second data (f1, 1) is written into Row 105 Column 1 (i.e., the address 2914); and so forth the last data (f1, 27) is written into the Row 1 Column 26 (i.e., the address 55). The similar procedure is repeated for each of the sub-sequent frames.

When a certain row in the memory of the de-interleaving unit 106 is fully rewritten by the decoded data, the de-interleaving unit 106 will then output all the data stored in that row to the C2 decoding unit 108. For example, when Row 108 is fully rewritten, the de-interleaving unit 106 will output all the data stored in Row 108 to the C2 decoding unit 108. In other words, when address 3051 (Row 108 Column 27) is rewritten by (f108, 27), all data stored in Row 108, including (f0, 0), (f4, 1), (f8, 2), ..., and (f108, 27) will be transferred to the C2 decoding unit 108.

Figure 9A:
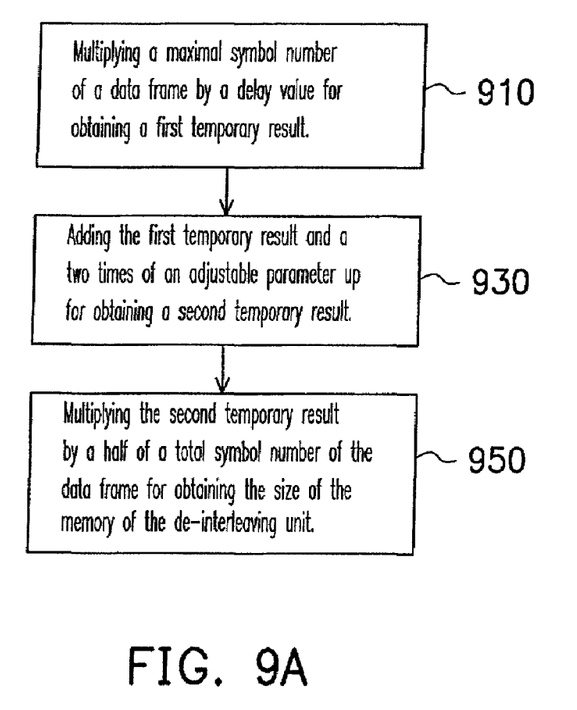
FIG. 9A is a flowchart showing the showing the method for determining a size of a memory of a de-interleaving unit according to the invention.
Figure 9B:
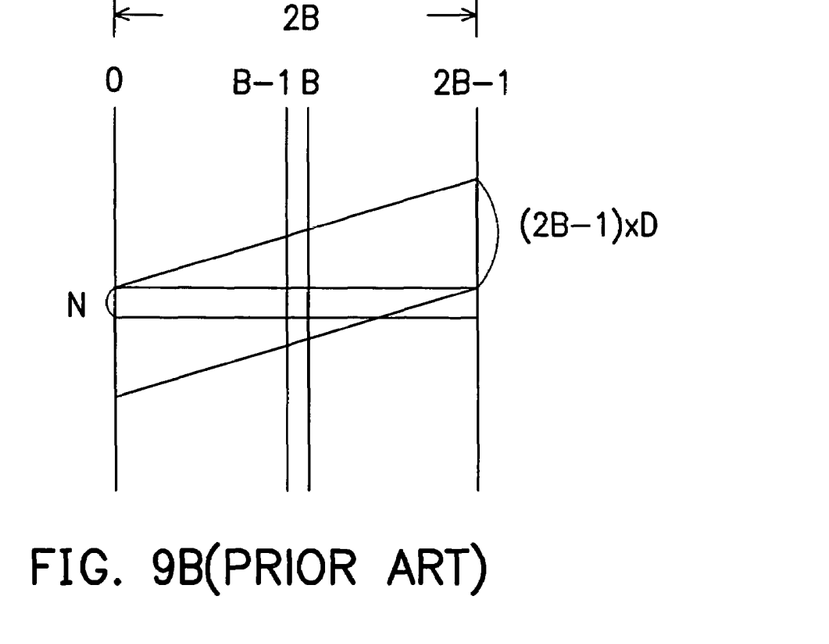
FIG. 9B (PRIOR ART) is a schematic diagram showing the method for determining a size of a memory of a de-interleaving unit.

FIG. 9B is a schematic diagram showing the method for determining a size of a memory of a de-interleaving unit based on the prior art. Since the data buffering and the data retrieving procedures are frame by frame progressed individually, and the data retrieving procedures always starts on till the data buffering procedure completed, thus the required size of the memory of the de-interleaving will be [(2B−1)*D]*2B, wherein the [(2B−1)*D] is the maximal delay taken for preserving the size of the memory for the buffered data to be retrieved. For example, letting B=14, D=4, N=1, and length of each symbol of a data frame is 1 byte, the size of the memory of the de-interleaving unit will be (27*4)*28=3024 bytes.

One drawback to the forgoing memory access scheme, however, is that the memory of the de-interleaving unit 106 is ineffectively utilized. In other words, some memory locations reserved are unused during the de-interleaving process since the memory always be allocated by a maximum.

SUMMARY OF THE INVENTION

This invention providing a method for utilizing a memory of a de-interleaving unit, the steps of the method comprising: determining a size of the memory according to a maximal symbol number of a data frame, a delay value, an adjustable parameter, and a half of a total symbol number of the data frame; allocating said memory based on the determined size of said memory; accessing the memory according to a write memory access index determined by a first algorithm during data buffering; and accessing the memory according to a read memory access index determined by a second algorithm during data retrieving.

The step of determining a size of the memory according to a maximal symbol number of a data frame, a delay value, an adjustable parameter, and a half of a total symbol number of the data frame further comprising: multiplying the maximal symbol number of a data frame by said delay value for obtaining a first temporary result; adding the first temporary result and two times of the adjustable parameter up for obtaining a second temporary result, wherein said adjustable parameter is less than or equal to half of said first temporary result; and multiplying the second temporary result by the half of said total symbol number of the data frame for obtaining the size of the memory.

This invention utilizing several parameters for write into and read from the memory of the de-interleaving unit. A Write Memory Address WMA of each symbol for locating a decoded data in the memory of the de-interlacing unit based on a Write Frame Index WFIDX and a Control Word Count CWCNT for data buffering, whereas a Read Memory Address RMA of each symbol for retrieving an encoded data in the memory of the de-interlacing unit based on a Read Frame Index RFIDX and a Control Word Count CWCNT for data retrieving.

This invention performing a write memory address calculating procedure for determining a value of the write memory address of each symbol while the write frame index is less than the second temporary result and the code word count is less than the total symbol number of the data frame, whereas the invention performing a read memory address calculating procedure for determining a value of the read memory address of each symbol when the read frame index is less than the second temporary result and the code word count is less than the total symbol number of the data frame.

This invention also providing a method for allocating a memory of a de-interleaving unit, the steps of the method comprising: multiplying a maximal symbol number of a data frame by a delay value for obtaining a first temporary result; adding the first temporary result and two times of an adjustable parameter up for obtaining a second temporary result, wherein said adjustable parameter is less than or equal to half of said first temporary result; multiplying the second temporary result by a half of a total symbol number of the data frame for obtaining the size of the memory of the de-interleaving unit; and allocating the memory based on the obtained size of the memory.

The mentioned method according to the invention reduced the required memory space in the de-interleaving unit by half as compared to the prior art for performing a de-interleaving process and is therefore more cost-effective than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention is designed for use to effectively use the memory of the de-interleaving unit for performing a de-interleaving process, so that the required memory can be reduced as compared to the prior art to make the memory utilization more cost-effective than the prior art.

Figure 3:
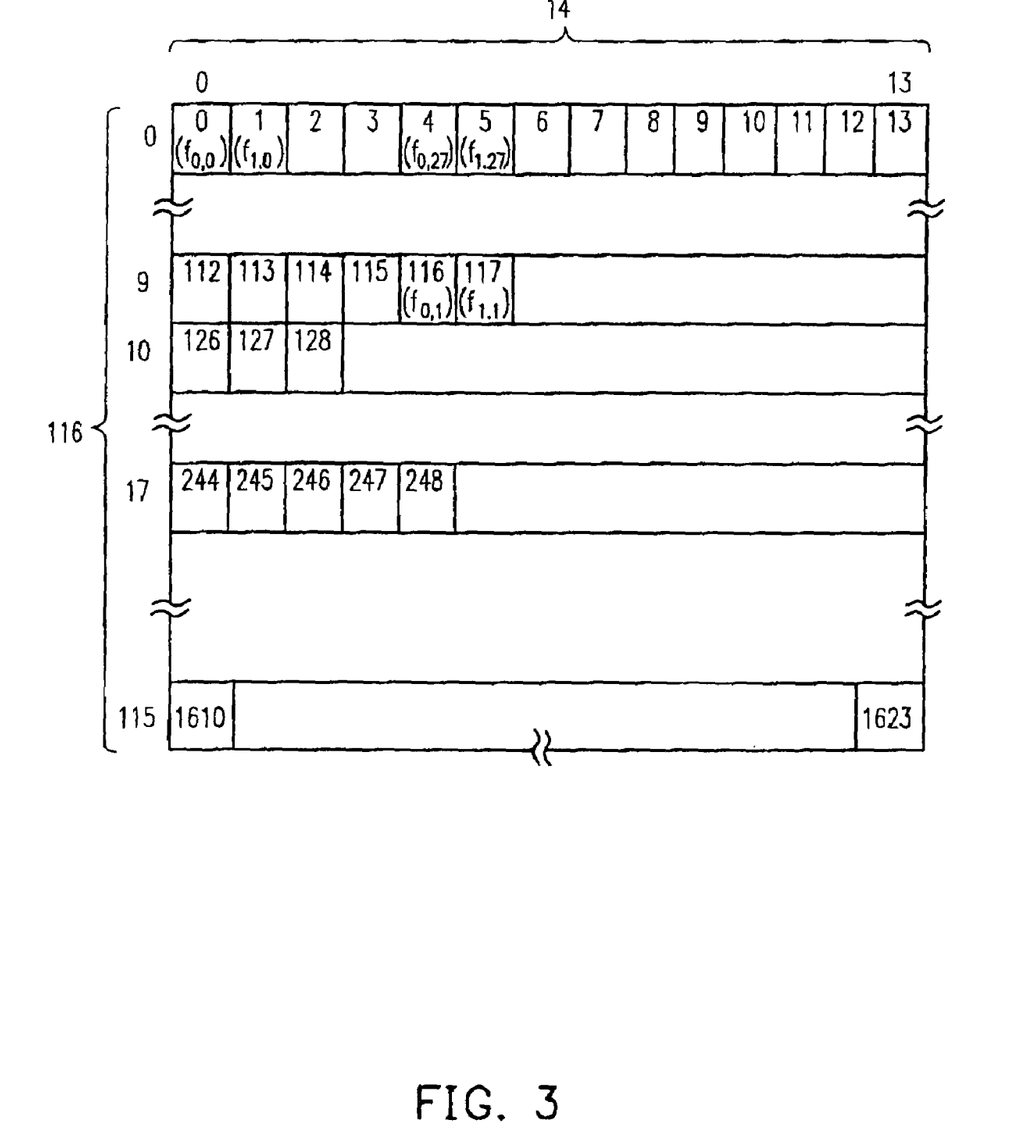
FIG. 3 is a schematic diagram showing the memory of the de-interleaving unit according to the invention.

Since the proposed method determining a size of the memory by multiplying a maximal symbol number of a data frame (denoted by "2B−1") by a delay value (denote by "D") for obtaining a first temporary result (denoted by "(2B−1) *D"); adding the first temporary result and a two times of adjustable parameter (denoted by "2N") up for obtaining a second temporary result (denote by "(2B−1)*D+2N"), wherein the adjustable parameter is less than or equal to half of the first temporary result; and multiplying the second temporary result by a half of the total symbol number of the data frame (denoted by "B") for obtaining the size of the memory. FIG. 3 is a schematic diagram showing the memory of the de-interleaving unit according to the invention. Letting N is equal to 1 and D is equal to 4, and the memory size of the de-interleaving unit 106 will be [(2B−1)*D+2N]*B=[27*4+ 2]*14=1540 bytes, whereas the needed memory size of the prior art will be [(2B−1)*D*2B]=(27*4*28)=3024 bytes, and it's almost half of that required by the prior art. It's noted that the N ranges from 1 to half of the first temporary result. That is the N is less than or equal to (2B−1)*D/2. For example, the half of the first temporary result will be 54 as a maximum for the CD-ROM drive according to the specification of the corresponding standard. Moreover, as shown in FIG. 3, the address range is from 0 to 1623 since the second temporary result is 116. In the following, the 28 8-bit data in the first frame from the C1 decoding unit 104 are respectively denoted by (f0, 0), (f0, 1), . . . , (f0, 27). When the C1 decoding unit 104 transfers the first frame to the de-interleaving unit 106, the data contained in the first frame are written into the memory of the de-interleaving unit 106 according to the method of the invention in such a manner that the first data (f0, 0) is written into Row 0 Column 0 (i.e., the address 0); the second data (f0, 1) is written into Row 9 Column 4 (i.e., the address 116); and so forth until the last data (f0, 27) is written into Row 0 Column 4 (i.e., the address 4). After the first frame is completely written into the memory, the second frame from the C1 decoding unit 104 is then written into the de-interleaving unit 106. The 28 8-bit data in the second frame from the C1 decoding unit 104 are respectively denoted by (f1, 0), (f1, 1) . . . , (f1, 27). When the C1 decoding unit 104 transfers the second frame to the de-interleaving unit 106, data in the second frame are written into the memory of the de-interleaving unit 106 according to the method of the invention in such a manner that the first data (f1, 0) is written into Row 0 Column 1 (i.e., the address 1); the second data (f1, 1) is written into Row 9 Column 5 (i.e., the address 117); and so forth until the last data (f1, 27) is written into Row 0 Column 5 (i.e., the address 5). The similar procedure is repeated for each of the subsequent frames.

Figure 4:
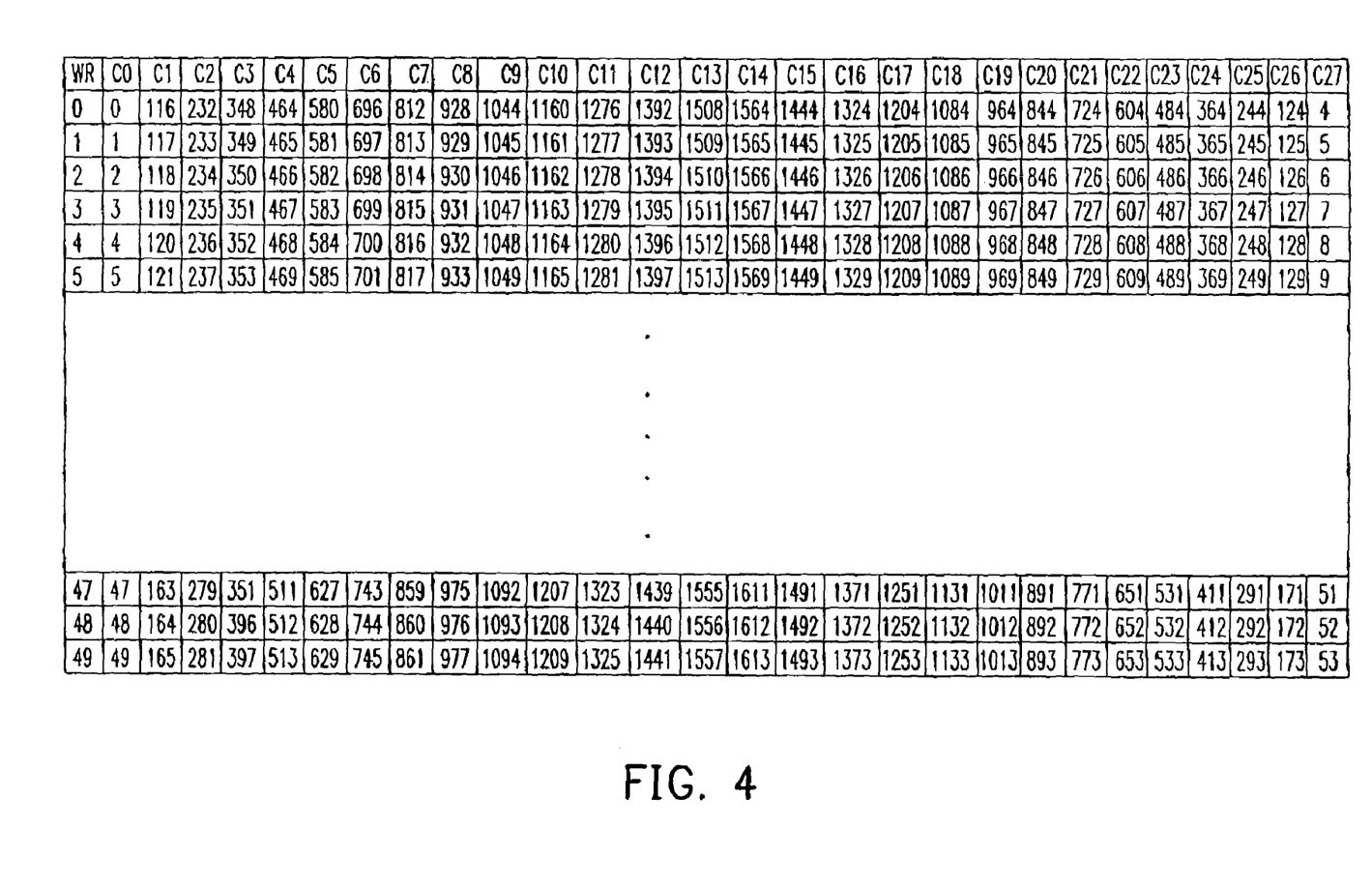
FIG. 4 is a schematic diagram showing the address mapping for each frame during data buffering.

FIG. 4 is a schematic diagram showing the address mapping for each frame during data buffering. In FIG. 4, the term "WR" represents the sequence of the frames to be de-interleaved. That is, WR 0 represents the first frame, and WR 1 represents the second frame and so on. The terms C0~C27 represent the symbol number of the data frame. The write memory address for each symbol of the first data frame (WR 0) is respectively 0, 116, 232, . . . 124 and 4 determined by a first algorithm during data buffering which comprising a write memory address calculating procedure, and the write address for other data frames were shown in FIG. 4.

Figure 5:
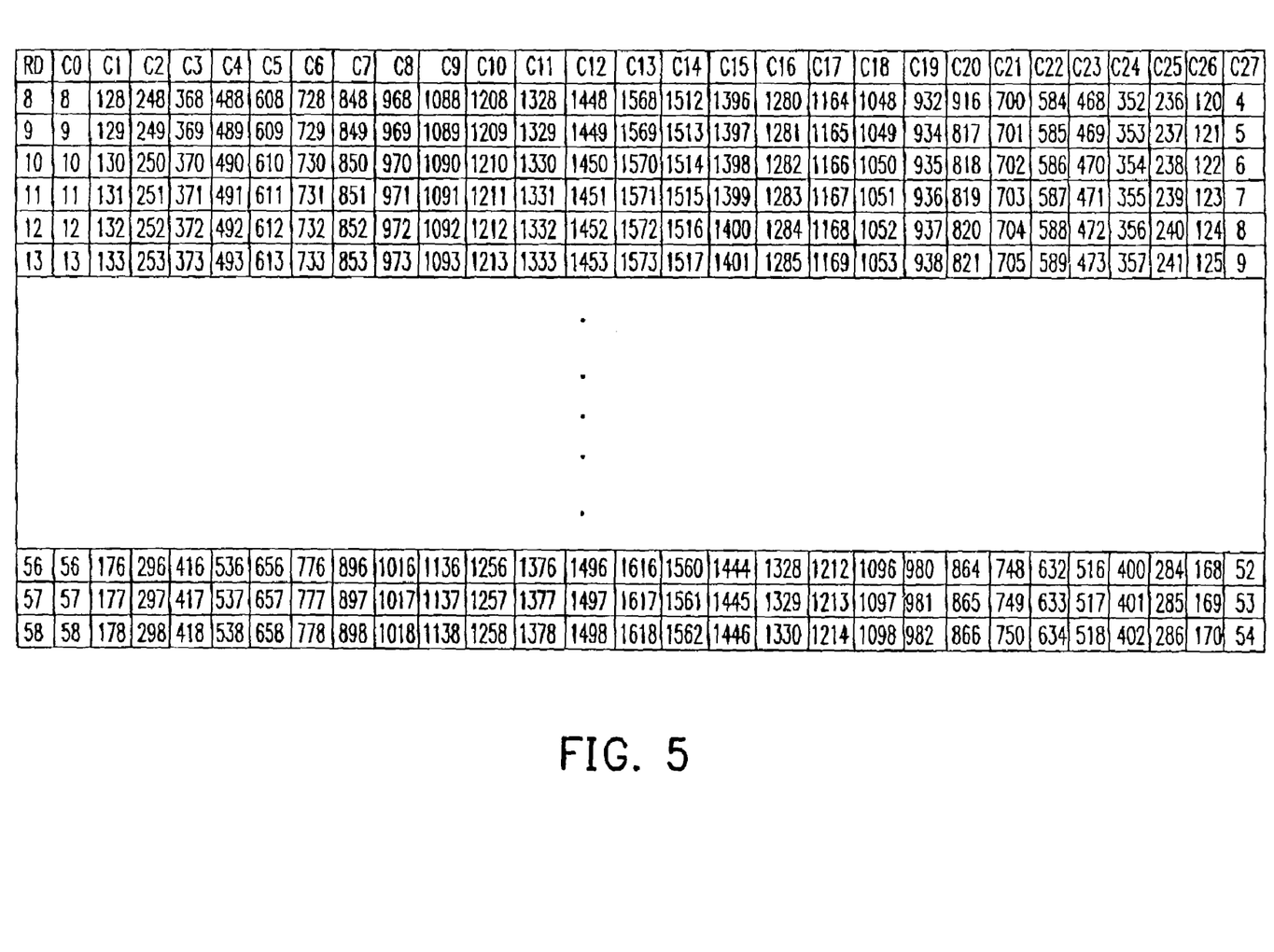
FIG. 5 is a schematic diagram showing the address mapping for each frame during data retrieving.

After the write operation for some incoming frames is completed, the de-interleaving unit 106 then reads data stored in the memory according to the method of the invention and outputs these data to the C2 decoding unit 108. FIG. 5 is a schematic diagram showing the address mapping for each frame during data retrieving and determined by a second algorithm during data retrieving which comprising a read memory address calculating procedure. It is to be noted that a certain frame can be read only after the last data in this frame is already rewritten (or updated). For example, as shown in FIG. 5, the data in Row 0 (which includes data in the address 8, 128, 248, . . . 4) can be read only after all data in Row 0 have been rewritten (i.e., the last address (address 4) in this frame is rewritten).

Figure 6:
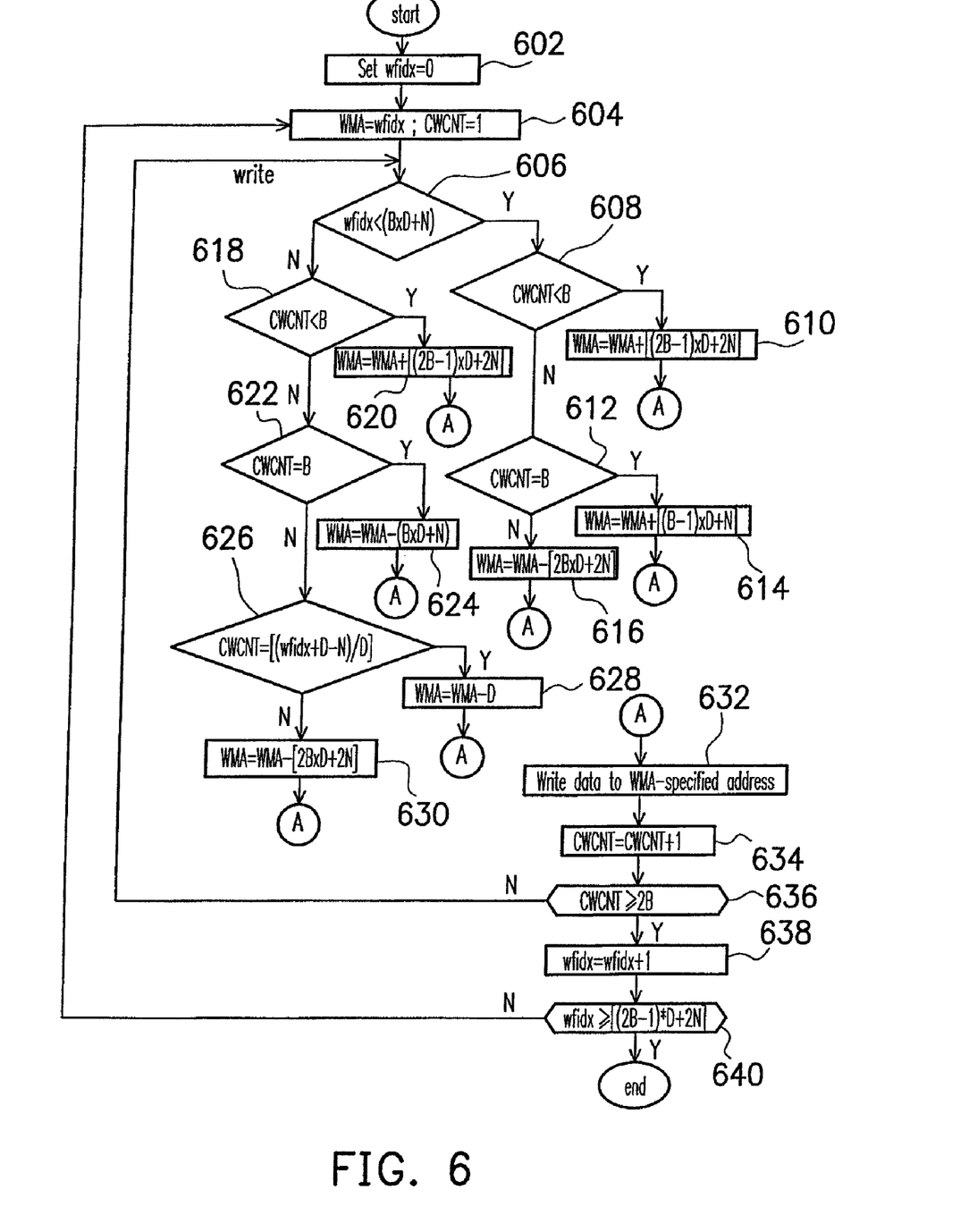
FIG. 6 is a flowchart showing the write memory address calculating procedure of the invention for data buffering.

The write memory address calculating procedure of the method of the invention due to the data buffering based on the parameter WMA for indicating the write memory address in the memory of the de-interleaving unit 106 of each symbol of a data frame; WFIDX for indicating the index of the currently-received frame from the C1 decoding unit 104 is currently being written into the de-interleaving unit 106; and CWCNT for indicating the symbol number of the currently-received frame is being written into the e-interleaving unit 106. FIG. 6 is a flowchart showing the write memory address calculating procedure of the invention for data buffering. As shown in FIG. 6, the step 602 and 604 indicating the write frame index and the code word count setting the initial value to 0 and 1 respectively, and the write memory address stores the copy of the write frame index. Besides, based on the step 636 to 640, the write memory address calculating procedure lasting during the write frame index is less than said second temporary result (e.g., 110) and said code word count is less than the total symbol number of said data frame (e.g., 28). As to the step 606 to 630, for example, letting B is 14, D is 4, and N is 1, step 610 shows that WMA will be set to (previous WMA+110) when WFIDX<57 as step 606 and CWCNT<14 as step 608; step 614 shows that WMA will be set to (precious WMA+53) when WFIDX<57 as step 606 and CWCNT=14 as step 612; step 616 shows that WMA will be set to (previous WMA−114) when WFIDX<57 as step 606 and CWCNT>14 as step 608; step 620 shows that WMA will be set to address (previous WMA+110) when WFIDX 57 as step 606 and CWCNT<14 as step 618; step 624 shows that WMA will be set to (previous WMA−57) when WFIDX 57 as step 606 and CWCNT=14 as step 622; step 628 shows that WMA will be set to (previous WMA−4) when WFIDX 57 as step 606 and CWCNT=[(WFIDX+4-1)/4] as step 626; and step 630 shows that WMA will be set to (previous WMA−114) when WFIDX 57 as step 606 and CWCNT≠[(WFIDX+4-1)/4] as step 626. In Step 632, data is written to WMA-specified address. In Step 634, CWCNT will be set to (CWCNT−1).

Figure 7:
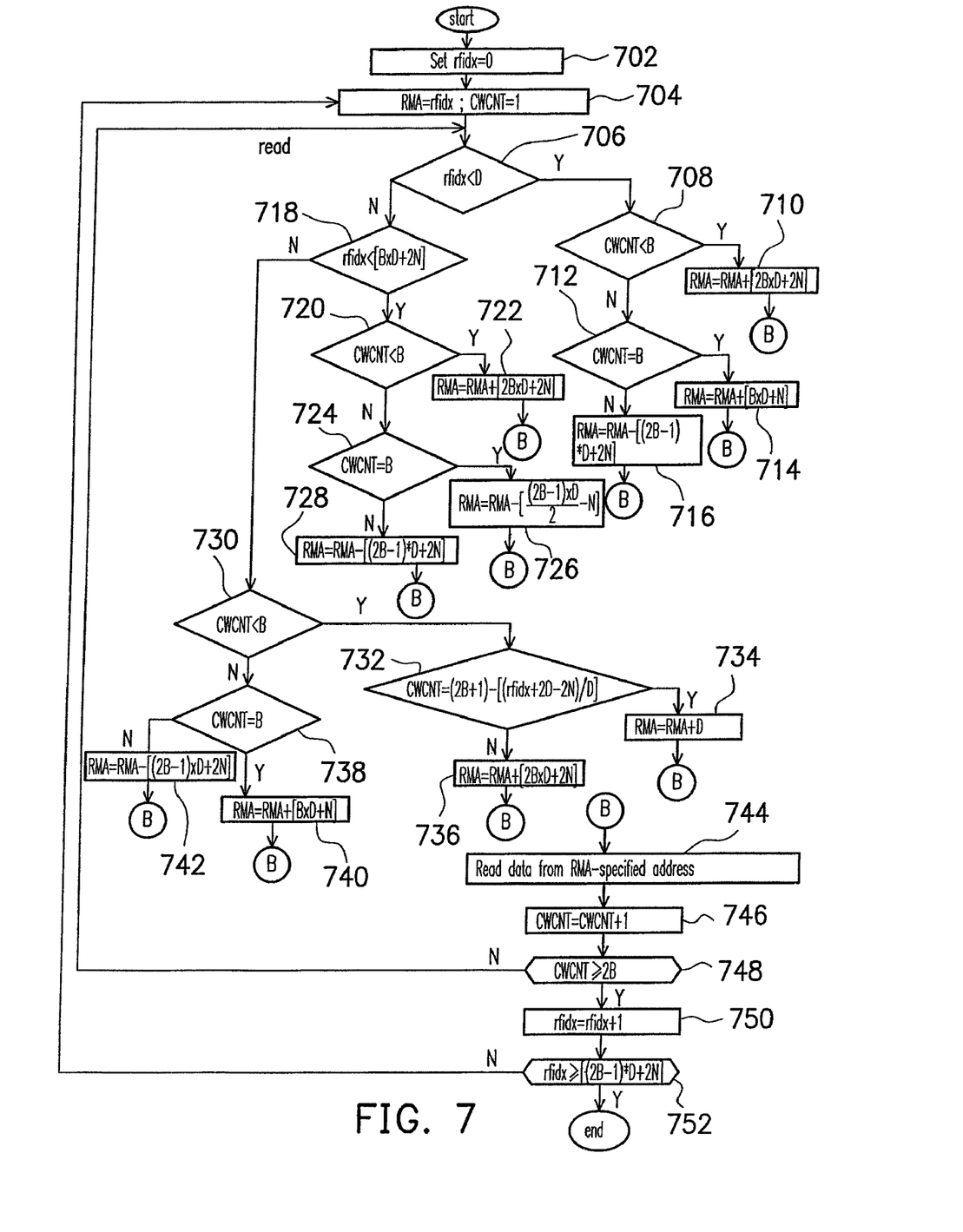
FIG. 7 is a flowchart showing the read memory address calculating procedure of the invention for data retrieving.

After a certain incoming frame is completely written, the de-interleaving unit 106 then reads the data stored in the memory according to the method of the invention and outputs these data to the C2 decoding unit 108. The read memory address calculating procedure of the method of the invention due to the data retrieving based on the parameter RMA for indicating the read memory address in the memory of the de-interleaving unit 106 of each symbol of a data frame to be accessed; RFIDX for indicating the index of the frame is currently being read from the de-interleaving unit 106; and CWCNT for indicating the symbol number of the data frame currently being read. FIG. 7 is a flowchart showing the read memory address calculating procedure of the invention for data retrieving. As shown in FIG. 7, the step 702 and 704 indicating the read frame index and the code word count setting the initial value to 0 and 1 respectively, and the read memory address stores the copy of the read frame index. Besides, based on the steps 748, 750, and 752, the read memory address calculating procedure lasting during the read frame index is less than said second temporary result (e.g., 110) and said code word count is less than the total symbol number of said data frame (e.g. 28). As to the step 706 to 740, for example, letting B is 14, D is 4, and N is 1, step 710 shows that RMA will be set to (previous RMA−110) when RFIDX<1 as step 706 and CWCNT<14 as step 708; step 714 shows that RMA will be set to (previous RMA+57) when RFIDX<1 as step 706 and CWCNT=14 as step 712; step 716 shows that RMA will be set to (previous RMA−110) when RFIDX<1 as step 706 and CWCNT>14 as step 708; step 722 shows that RMA will be set to (previous RMA+114) when 58>RFIDX≧N as step 706 and step 718, and CWCNT<14 as step 720; step 726 shows that RMA will be set to (previous RMA−53) when 58>RFIDX≧N as step 706 and step 718, and CWCNT=14 as step 724; step 728 shows that RMA will be set to (previous RMA−110) when 58>RFIDX≧=N as step 706 and step 718, and CWCNT>14 as step 708; step 734 shows that RMA will be set to (previous RMA+4) when RFIDX>58 as step 718, and CWCNT<14 as step 730 and CWCNT=[29−(RFIDX+6)/4] as step 732; step 736 shows that RMA will be set to (previous RMA+114) when RFIDX>58 as step 718, and CWCNT<14 and CWCNT≠[29−(RFIDX+6)/4] as step 732; step 740 shows that RMA will be set to (previous RMA+57) when RFIDX>58 as step 718, and CWCNT=14 as step 738; and step 742 shows that RMA will be set to (previous RMA−110) when RFIDX>58 as step 718, and CWCNT>14 as step 738. In step 744, data is read from RMA-specified address. In step 746, CWCNT will be set to (CWCNT−1).

Figure 8:
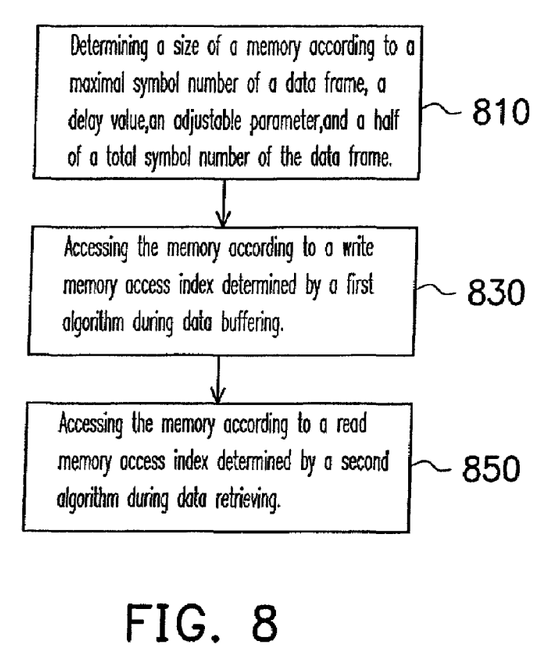
FIG. 8 is a flowchart showing the method for utilizing a memory of a de-interleaving unit according to the invention.

FIG. 8 is a flowchart showing the method for utilizing a memory of a de-interleaving unit according to the invention. At first, the method determining a size of the memory according to a maximal symbol number of a data frame, a delay value, an adjustable parameter, and a half of a total symbol number of said data frame in step 810. Second, accessing the memory according to a write memory address determined by a first algorithm during data buffering in step 830; and accessing said memory according to a read memory address determined by a second algorithm during data retrieving in step 850. Moreover, step 810 further comprising multiplying the maximal symbol number of a data frame (denoted by "2B−1") by the delay value (denoted by "D") for obtaining a first temporary result (denoted by "(2B−1)*D"); adding the first temporary result and a two times of said adjustable parameter (denoted by "2N") up for obtaining a second temporary result (denoted by "(2B−1)*D+2N"), wherein said adjustable parameter is less than or equal to half of said first temporary result; and multiplying the second temporary result by the half of the total symbol number of the data frame (denoted by "B") for obtaining the size of the memory (denoted by "[(2B−1)*D+2N]*B"). Besides, step 830 further comprising providing and setting an initial value for the write memory address WMA, a write frame index WFIDX, and a code word count CWCNT for writing data to the memory; and performing a write memory address calculating procedure for determining a value of the memory write address of each symbol during the write frame index is less than the total symbol number of the data frame (e.g., 28) and the code word count is less than the second temporary result (e.g., 110). Furthermore, step 850 further comprising providing and setting an initial value for a read memory address RMA, a read frame index RFIDX, and a code word count CWCNT for reading data to the memory of the de-interleaving unit; and performing a read memory address calculating procedure for determining a value of the read memory address of each symbol when the read frame index is less than the total symbol number of the data frame (e.g., 28) and the code word count is less than the second temporary result (e.g., 110).

Figure 9C:
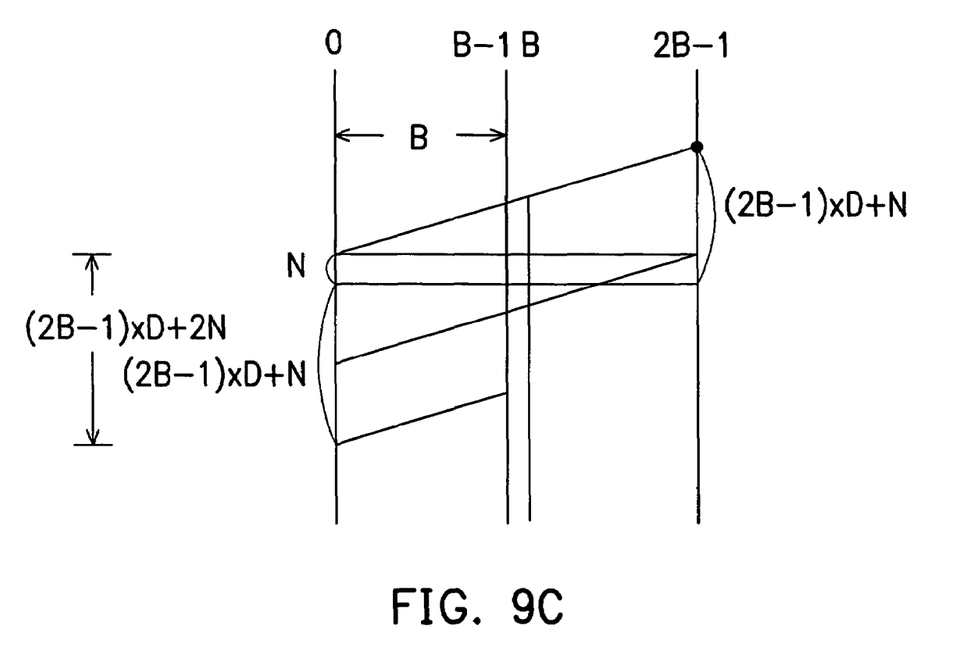
FIG. 9C is a schematic diagram showing the method for determining a size of a memory of a de-interleaving unit.

FIG. 9A is a flowchart showing the showing the method for determining a size of a memory of a de-interleaving unit according to the invention. The method multiplying the maximal symbol number of a data frame (denoted by "2B−1") by the delay value (denoted by "D") for obtaining a first temporary result (denoted by "(2B−1)*D") in step 910; adding the first temporary result and a two times of said adjustable parameter (denoted by "2N") up for obtaining a second temporary result (denoted by "(2B−1)*D+2N") in step 920, wherein said adjustable parameter is less than or equal to half of the first temporary result (denoted by "(2B−1)*D/2") and ranges from 1 to 54 for a CD-ROM drive; and multiplying the second temporary result by the half of the total symbol number of the data frame (denoted by "B") for obtaining the size of the memory (denoted by "[(2B−1)*D+2N]*B"). For example, letting B=14, D=4, N=1, and length of each symbol of a data frame is 1 byte, the size of the memory of the de-interleaving unit will be (27*4+2)*14=1540 bytes. It's noted that the adjustable parameter N is provided for adapting the accessing timing of the architecture of the memory of the de-interleaving unit for pre-venting the data override. Furthermore, FIG. 9C is a schematic diagram showing the method for determining a size of a memory of a de-interleaving unit. Since the invention utilizing the pipeline architecture of the memory of the de-interlacing and corresponding data buffering algorithm and data retrieving algorithm, the required size of the memory of the de-interleaving based on present invention will be [(2B−1)*D+2N]*B since the right part of the area can be reduced and viewed as the bottom part of the area. For example, letting B=14, D=4, N=1, and length of each symbol of a data frame is 1 byte, the size of the memory of the de-interleaving unit will be (27*4+2)*14=1540 bytes.

The invention can reduce the required memory space in the de-interleaving unit, substantially by half, for performing the de-interleaving process and is therefore more cost-effective than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for utilizing a memory of a de-interleaving unit comprising:
   determining a size of said memory according to a maximal symbol number of a data frame, a delay value, an adjustable parameter, and a half of a total symbol number of said data frame;
   allocating said memory based on the determined size;
   accessing said memory according to a write memory address determined by a first algorithm during data buffering; and
   accessing said memory according to a read memory address determined by a second algorithm during data retrieving.

2. The method of claim 1, further comprising:
   multiplying said maximal symbol number of a data frame by said delay value for obtaining a first temporary result;
   adding said first temporary result and two times of said adjustable parameter up for obtaining a second temporary result, wherein said adjustable parameter is less than or equal to half of said first temporary result; and
   multiplying said second temporary result by said half of said total symbol number of said data frame for obtaining said size of said memory.

3. The method of claim 2, wherein said first algorithm comprises:
   providing and setting an initial value for said write memory address, a write frame index, and a code word count for writing data to said memory; and
   performing a write memory address calculating procedure for determining a value of said memory write address of each symbol while said write frame index is less than said second temporary result and said code word count is less than said total symbol number of said data frame.

4. The method of claim 3, wherein said write memory address calculating procedure comprises:
   (1) when wfidx<(B*D+N) and CWCNT<B, setting said write memory address WMA as:

$WMA = WMA + [(2B-1)D + 2N];$ (2) when wfidx<(B*D+N) and CWCNT=B, setting said write memory address WMA as:

$WMA = WMA + [(B-1)D + N];$ (3) when wfidx<(B*D+N) and CWCNT>B, setting said write memory address WMA as:

$WMA = WMA - [2B*D + 2N];$ (4) when wfidx≧(B*D+N) and CWCNT<B, setting said write memory address WMA as:

$WMA = WMA + [(2B-1)*D + 2N];$ (5) when wfidx≧(B*D+N) and CWCNT=B, setting said write memory address WMA as:

$WMA = WMA + [B*D + N];$ (6) when wfidx≧(B*D+N) and CWCNT=[(wfidx+D−N)/D], setting said write memory address WMA as:

$WMA = WMA - D;$ and (7) when wfidx≧(B*D+N) and CWCNT≠[(wfidx+D−N)/D], setting said write memory address WMA as:

$WMA = WMA - 2B*D + 2N;$ wherein "wfidx" represents said write frame index, "CWCNT" represents said code word count, said previous write memory address indicates the write memory address of the previously process symbol, "2B−1" represents said total symbol number of said data frame, "D" represents said delay value and "N" represents said adjustable parameter.

5. The method of claim 3, wherein said write memory address calculating procedure comprises:
   adjusting said code word count when said value of said write memory address of each symbol is determined and determining whether said code word count is less than said total symbol number of said data frame; and
   adjusting said write frame index when said code word count is greater than or equal to said total symbol number of said data frame and determining whether said write frame index is greater than or equal to said second temporary result.

6. The method of claim 3, wherein said write memory address calculating procedure comprises:
   resetting said code word count according said initial value of said code word count; and
   resetting said write memory address according to said write frame index when said write frame index is less than said second temporary result.

7. The method of claim 2, wherein said second algorithm comprises:
   providing and setting an initial value for a read memory address, a read frame index, and a code word count for reading data from said memory of said de-interleaving unit; and
   performing a read memory address calculating procedure for determining a value of said read memory address of each symbol when said read frame index is less Man said second temporary result and said code word count is less than said total symbol number of said data frame.

8. The method of claim 7, wherein said read memory address calculating procedure comprises:
(1) when rfidx<D and CWCNT<B, setting said read memory address RMA as:

RMA=RMA+[2B*D+2N];

(2) when rfidx<D and CWCNT=B, setting said read memory address RMA as:

RMA=RMA+[B*D+N];

(3) when rfidx<D and CWCNT>B, setting said read memory address RMA as:

RMA=RMA-[(2B-1)*D+2N];

(4) when D<rfidx<(B*D+2N) and CWCNT<B, setting said read memory address RMA as:

RMA=RMA-[2B*D+2N];

(5) when D<rfidx<(B*D+2N) and CWCNT=B, setting said read memory address RMA as:

RMA=RMA-[(2B-1)*D/2-N];

(6) when D<rfidx<(B*D+2N) and CWCNT>B, setting said read memory address RMA as:

RMA=RMA-[(2B-1)*D+2N];

(7) when rfidx>(B*D+2N), CWCNT<B and CWCNT=(2B+1)-[(rfidx+2D-2N)/D], setting said read memory address RMA as:

RMA=RMA+D;

(8) when rfidx>(B*D+2N), CWCNT<B and CWCNT≠(2B+1)-[(rfidx+2D-2N)/D], setting said read memory address RMA as:

RMA=RMA+(2B*D+2N);

(9) when rfidx>(B*D+2N) and CWCNT=B, setting said read memory address RMA as:

RMA=RMA+(B*D+N); and (10) when rfidx>(B*D+2N) and CWCNT>B, setting said read memory address RMA as:

RMA=RMA-[(2B-1)*D+2N);

wherein "rfidx" represents said read frame index, "CWCNT" represents said code word count, said previous read memory address indicates the read memory address of the previously process symbol, "2B-1" represents said total symbol number of said data frame, "D" represents said delay value and "N" represents said adjustable parameter.

9. The method of claim 7, wherein said read memory address calculating procedure comprises:
adjusting said code word count when said read memory address of each symbol is determined and determining whether said code word count is less than said total symbol number of said data frame; and
adjusting said read frame index when said code word count is greater than or equal to said total symbol number of said data frame and determining whether said read frame index is greater than or equal to said second temporary result.

10. The method of claim 7, wherein said read memory address calculating procedure comprises:
resetting said code word count according said initial value of said code word count; and resetting said read memory address according to said read frame index when said read frame index is less than said second temporary result.

11. The method of claim 2 comprises:
setting said adjustable parameter to 1 so that said size of said memory is a minimum.

12. A method for allocating a memory of a de-interleaving unit, comprising:
multiplying a maximal symbol number of a data frame by a delay value to obtain a first temporary result;
adding up said first temporary result and two times of an adjustable parameter to obtain a second temporary result, wherein said adjustable parameter is less than or equal to half of said first temporary result;
multiplying said second temporary result by a half of a total symbol number of said data frame to obtain a size of said memory of said de-interleaving unit; and
allocating the memory based on the obtained size of the memory.

13. The method of claim 12, wherein said adjustable parameter ranges from 1 to 54 for a CD-ROM drive.

14. A computer-readable storage medium storing computer-executable instructions that, when executed, perform a method for utilizing a memory of a de-interleaving unit, the method comprising:
determining a size of the memory according to a maximal symbol number of a data frame, a delay value, an adjustable parameter, and a half of a total symbol number of the data frame; and
allocating the memory based on the determined size.

15. The computer-readable storage medium of claim 14, further comprising accessing the memory according to a write memory address determined by a first algorithm during data buffering.

16. The computer-readable storage medium of claim 14, further comprising accessing the memory according to a read memory address determined by a second algorithm during data retrieving.

17. The computer-readable storage medium of claim 14, further comprising:
accessing the memory according to a write memory address determined by a first algorithm during data buffering;
accessing the memory according to a read memory address determined by a second algorithm during data retrieving;
multiplying the maximal symbol number of a data frame by the delay value for obtaining a first temporary result;
adding the first temporary result and two times of the adjustable parameter up for obtaining a second temporary result, wherein the adjustable parameter is less than or equal to half of the first temporary result; and
multiplying the second temporary result by the half of the total symbol number of the data frame for obtaining the size of the memory.

18. The computer-readable storage medium of claim 17, wherein the first algorithm comprises:
providing and setting an initial value for the write memory address, a write frame index, and a code word count for writing data to the memory; and
performing a write memory address calculating procedure for determining a value of the memory write address of each symbol while the write frame index is less than the second temporary result and the code word count is less than the total symbol number of the data frame.

19. The computer-readable storage medium of claim 17, wherein the second algorithm comprises:

providing and setting an initial value for a read memory address, a read frame index, and a code word count for reading data from the memory of the de- interleaving unit; and performing a read memory address calculating procedure for determining a value of the read memory address of each symbol when the read frame index is less than the second temporary result and the code word count is less than the total symbol number of the data frame.

20. A computer-readable storage medium storing computer-executable instructions that, when executed, perform a method for allocating a memory of a de- interleaving unit, comprising:

multiplying a maximal symbol number of a data frame by a delay value for obtaining a first temporary result;

adding up the first temporary result and two times of an adjustable parameter for obtaining a second temporary result, wherein the adjustable parameter is less than or equal to half of the first temporary result;

multiplying the second temporary result by a half of a total symbol number of the data frame for obtaining a size of the memory of the de-interleaving unit; and allocating the memory based on the obtained size of the memory.

21. The computer-readable storage medium of claim 20, wherein the adjustable parameter ranges from 1 to 54 for a CD-ROM drive.

22. An optical storage medium communicably coupled to a memory and a de-interleaving unit, the de-interleaving unit comprising:

a component that is configured to determine a size of the memory according to maximal symbol number of a data frame, a delay value, an adjustable parameter, and a half of a total symbol number of the data frame; and a component that is configured to allocate the memory based on the determined size.

23. The de-interleaving unit of claim 22, further, comprising a component that is configured to access the memory according to a write memory address determined by a first algorithm during data buffering.

24. The de-interleaving unit of claim 22, further comprising a component that is configured to access the memory according to a read memory address determined by a second algorithm during data retrieving.

25. The de-interleaving unit of claim 22, further comprising:

a component that is configured to access the memory according to a write memory address determined by a first algorithm during data buffering;

a component that is configured to access the memory according to a read memory address determined by a second algorithm during data retrieving; and a component that is configured to:

multiply the maximal symbol number of a data frame by the delay value to obtain a first temporary result;

add up the first temporary result and two times of the adjustable parameter to obtain a second temporary result, wherein the adjustable parameter is less than or equal to half of the first temporary result; and multiply the second temporary result by the half of the total symbol number of the data frame to obtain the size of the memory.

26. An optical storage medium communicably coupled to a memory and a de-interleaving unit, the de-interleaving unit comprising:

a component that is configured to multiply a maximal symbol number of a data frame by a delay value for obtaining a first temporary result;

a component that is configured to add up the first temporary result and two times of an adjustable parameter for obtaining a second temporary result, wherein the adjustable parameter is less than or equal to half of the first temporary result;

a component that is configured to multiply the second temporary result by a half of a total symbol number of the data frame for obtaining a size of the memory of the de-interleaving unit; and a component that is configured to allocate the memory based on the obtained size of the memory.

* * * * *

UNITED STATES PATENT AND TRADEMARK OFFICE
CERTIFICATE OF CORRECTION

PATENT NO. : 7,512,764 B2 Page 1 of 1
APPLICATION NO. : 10/843706
DATED : March 31, 2009
INVENTOR(S) : Chang It is certified that error appears in the above-identified patent and that said Letters Patent is hereby corrected as shown below:

In column 1, line 45, after "1)" insert -- , --.

In column 1, line 58, after "1)" insert -- , --.

In column 5, line 26, delete "precious" and insert -- previous --, therefor.

In column 9, line 1, in claim 7, delete "Man" and insert -- than --, therefor.

In column 11, line 3, in claim 19, delete "de- interleaving" and insert -- de-interleaving --, therefor.

In column 11, line 12, in claim 20, delete "de- interleaving" and insert -- de-interleaving --, therefor.

In column 11, line 32, in claim 22, after "to" insert -- a --.

Signed and Sealed this

Thirtieth Day of June, 2009

JOHN DOLL
*Acting Director of the United States Patent and Trademark Office*